United States Patent
Chung

(10) Patent No.: US 6,301,177 B1
(45) Date of Patent: *Oct. 9, 2001

(54) INTERNAL POWER SUPPLY VOLTAGE GENERATING CIRCUIT AND THE METHOD FOR CONTROLLING THEREOF

(75) Inventor: Hwi-Taek Chung, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/457,576

(22) Filed: Dec. 9, 1999

Related U.S. Application Data

(63) Continuation of application No. 09/199,166, filed on Nov. 25, 1998, now Pat. No. 6,031,774.

(30) Foreign Application Priority Data

Nov. 25, 1997 (KR) .................................................. 97-62883

(51) Int. Cl.$^7$ ...................................................... G11C 7/00
(52) U.S. Cl. ................ 365/204; 365/185.25; 365/185.33
(58) Field of Search ..................................... 365/204, 203, 365/185.17, 185.25, 185.31, 185.33; 361/111, 91

(56) References Cited

U.S. PATENT DOCUMENTS

| | | | |
|---|---|---|---|
| 5,361,185 | * 11/1994 | Yu | ........................................ 361/111 |
| 5,511,022 | * 4/1996 | Yin et al. | ........................ 365/185.17 |
| 6,031,774 | * 2/2000 | Chung | .................................. 365/204 |

* cited by examiner

*Primary Examiner*—David Nelms
*Assistant Examiner*—David Lam
(74) *Attorney, Agent, or Firm*—Jones Volentine, L.L.C.

(57) ABSTRACT

A memory device includes first, second, and third discharging units, which are connected to a negative voltage node, for discharging the negative voltage to a ground voltage through three steps which are sequentially conductive. The first discharging unit discharges the negative voltage in response to a first signal and a second signal. It does so when the negative voltage is a first voltage level. The second discharging unit discharges the negative voltage in response to the second signal and a third signal. It does so when the negative voltage is a second voltage level. The third discharging unit discharges the negative voltage in response to a fourth signal and a fifth signal. It does so when the negative voltage is a third voltage level.

4 Claims, 3 Drawing Sheets

INTERNAL POWER SUPPLY VOLTAGE GENERATING CIRCUIT AND THE METHOD FOR CONTROLLING THEREOF

This application is a continuation application of "INTERNAL POWER SUPPLY VOLTAGE GENERATING CIRCUIT AND THE METHOD FOR CONTROLLING THEREOF," by Hwi-Taek Chung, Ser. No. 09/199,166, filed on Nov. 25, 1998 now U.S. Pat. No. 6,031,774, the contents of which are herein incorporated by reference in its entirety, which application relies for priority upon Korean Patent Application No. 97-62883, filed on Nov. 25, 1997, the contents of which are also incorporated by reference in their entirety.

FIELD OF THE INVENTION

The present invention relates to flash memory devices, and more particularly to circuits for discharging negative high voltages after an erase operation.

BACKGROUND OF THE INVENTION

A typical construction of a cell (or cell transistor) of a flash memory is shown in FIG. 1. This cell can be used for multi-bit storage. A source 3 and a drain 4, each being formed of an N+ diffused region in a P+ semiconductor substrate 2, are separated from each other through a channel region 5, which is also defined in the substrate 2. A thin insulating film 7, which is under 100 Å, is then formed over the channel region 5, and a floating gate 6 is then formed over the thin insulating film 7. A second insulating film 9, such as an O-N-O (Oxide-Nitride-Oxide) film, is formed over the floating gate 6 and a control gate 8 is then formed over the second insulating film 9. The second insulating film 9 acts to isolate a control gate 8 from the floating gate 6. The source 3, drain 4, control gate 8, and substrate 2 are each connected to corresponding voltage sources $V_s$ (the drain voltage), $V_d$ (the source voltage), $V_g$ (the gate voltage), and $V_b$ (the bulk voltage), respectively for programming, erasing, and reading operations.

In programming, as is well known, a selected memory cell is programmed by means of a hot electron injection between the channel region 5 and the floating gate 6. In this case, the source 3 and substrate 2 are held at a ground voltage, a high voltage (e.g., $V_g=10V$) is applied to the control gate 8, and a voltage sufficient to induce the hot electrons therein (e.g., 5V through 6V) is provided to the drain 4. After it is programmed, a threshold voltage of the selected memory cell is increased by the deposition of electrons.

To read data from the programmed cell, a voltage of about 1V is applied to the drain 4, a power source voltage (about 4.5V) is applied to the control gate 8, and the source 3 is held to the ground voltage. Since the increased threshold voltage of the programmed memory cell acts as a blocking potential even upon the gate voltage during a read-out operation, the programmed cell is considered to be an off-cell, which has a threshold voltage between 6V and 7V.

Erasing a memory cell is accomplished by conducting an F-N (Fowler-Nordheim) tunneling effect, in which the control gate 8 is coupled to a high negative voltage of about −10V, and the substrate 2 (or bulk) is coupled to a positive voltage of about 5V. This acts to induce the tunneling between the substrate 2 and the control gate 8. While doing this, the drain 4 is conditioned to a high impedance state (i.e., a floating state). A strong electric field, induced by the voltage bias conditions is applied between the control gate 8 and a bulk region (i.e., the substrate 2), and causes the electrons to move into the source 3. The F-N tunneling normally occurs when an electric field of 6~7MV/cm is developed between the floating gate 6 and the substrate 2, which are separated by the thin insulating film 7 having a thickness of under 100 Å. The erased cell has a lower threshold voltage than before, and is thereby sensed as an on-cell, which has a threshold voltage between 1~3V.

In a usual architecture of a memory cell array in a flash memory, the bulk region (or the substrate 2) combines active regions of memory cells, so that memory cells formed in the same bulk region are spontaneously erased at the same time. Therefore, units of erasing (hereinafter referred to as "sectors", e.g., one sector of 64K) are determined in accordance with the number of separate bulk regions. Table 1 shows levels of the voltages used in programming, erasing, and reading.

TABLE 1

| operation mode | $V_g$ | $V_d$ | $V_s$ | $V_b$ |
| --- | --- | --- | --- | --- |
| programming | 10 V | 5 ~ 6 V | 0 V | 0 V |
| erasing | −10 V | floating | floating | 5 V |
| reading | 4.5 V | 1 V | 0 V | 0 V |
| erase repairing | 3 V | 5 ~ 6 V | 0 V | 0 V |

Once an erase operation for memory cells is performed, memory cells whose threshold voltages are under 0V, among the memory cells, are erased. The threshold voltages of these memory cells are positioned at an range of uniform distribution. The memory cells with threshold voltages of 0V, are referred to as over-erased cells that have to be cured by a repairing operation (i.e., erase repairing) in order to have threshold voltages set higher than 0V.

In a general erase repairing operation, the source 3 and substrate 2 of the over-erased memory cell are grounded, the control gate 8 is connected to a positive voltage of about 3V that is lower than a program voltage (e.g., 10V), and the drain 4 is connected to a positive voltage of about 5V through 6V. As a result of this, negative charges smaller than those in the programming operation are gathered in the floating gate electrode 6 and so the negative potential formed at the gate electrode causes the threshold voltage of the memory cell to be increased over 0V (or the ground voltage).

During an erase operation, as shown in Table 1, word lines coupled to control gates 8 of all of the memory cells belonging to a selected sector should be charged to a negative voltage. However, for performing a verifying operation and another programming and reading after the erase cycle, the word lines that have been charged to a negative voltage must first be discharged to 0V (or the ground voltage) from these higher negative voltages. While the negative voltage about −10V at the word line is being brought back to 0V, a high electric field may appear between the gate electrode and the source 3 or the drain 4, which may destroy an oxide layer (i.e., the thin insulating layer 7) between the floating gate 6 and a surface of the substrate 2. Alternately, this may induce a breakdown between a bulk (i.e., the substrate 2) and a junction in the memory cell transistor.

SUMMARY OF THE INVENTION

The present invention is intended to solve the problems. And, it is an object of the invention to provide a circuit of a non-volatile flash memory device for preventing a destruction of a gate oxide layer and physical damages in a memory cell transistor when a negative high voltage is being discharged after an erase operation.

In order to accomplish those objects, a memory device includes an output node having a negative voltage, a first discharging unit, being connected to the output node, for discharging the negative voltage in response to a first signal and a second signal, a second discharging unit, being connected to the output node, for discharging the negative voltage in response to the second signal and a third signal, and a third discharging unit, being connected to the output node, for discharging the negative voltage in response to a fourth signal and a fifth signal.

Another feature of a memory device includes a node of a negative voltage, a first discharging unit, being connected to the node, for discharging the negative voltage in response to a first signal and a second signal, when the negative voltage is a first voltage level, a second discharging unit, being connected to the node, for discharging the negative voltage in response to the second signal and a third signal, when the negative voltage is a second voltage level, and a third discharging unit, being connected to the node, for discharging the negative voltage in response to a fourth signal and a fifth signal, when the negative voltage is a third voltage level.

BRIEF DESCRIPTION OF THE DRAWINGS

For a better understanding of the invention, and to show how embodiments of the same may be carried into effect, reference will now be made, by way of example, to the accompanying drawings, in which.

In these figures, like reference numerals denote like or corresponding parts.

DETAILED DESCRIPTION OF THE PREFERRED EMBODIMENTS

Applicable embodiments of the invention will be described as follows, with reference to the appended drawings.

Figure 1:
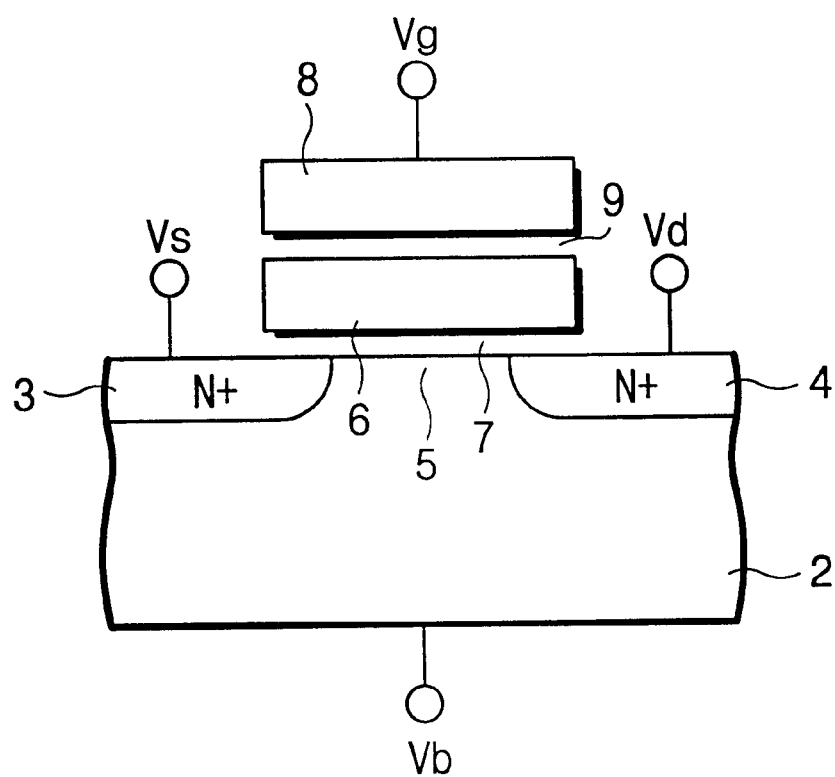
FIG. 1 shows a section of an electrically erasable and programmable flash memory cell.
Figure 2:
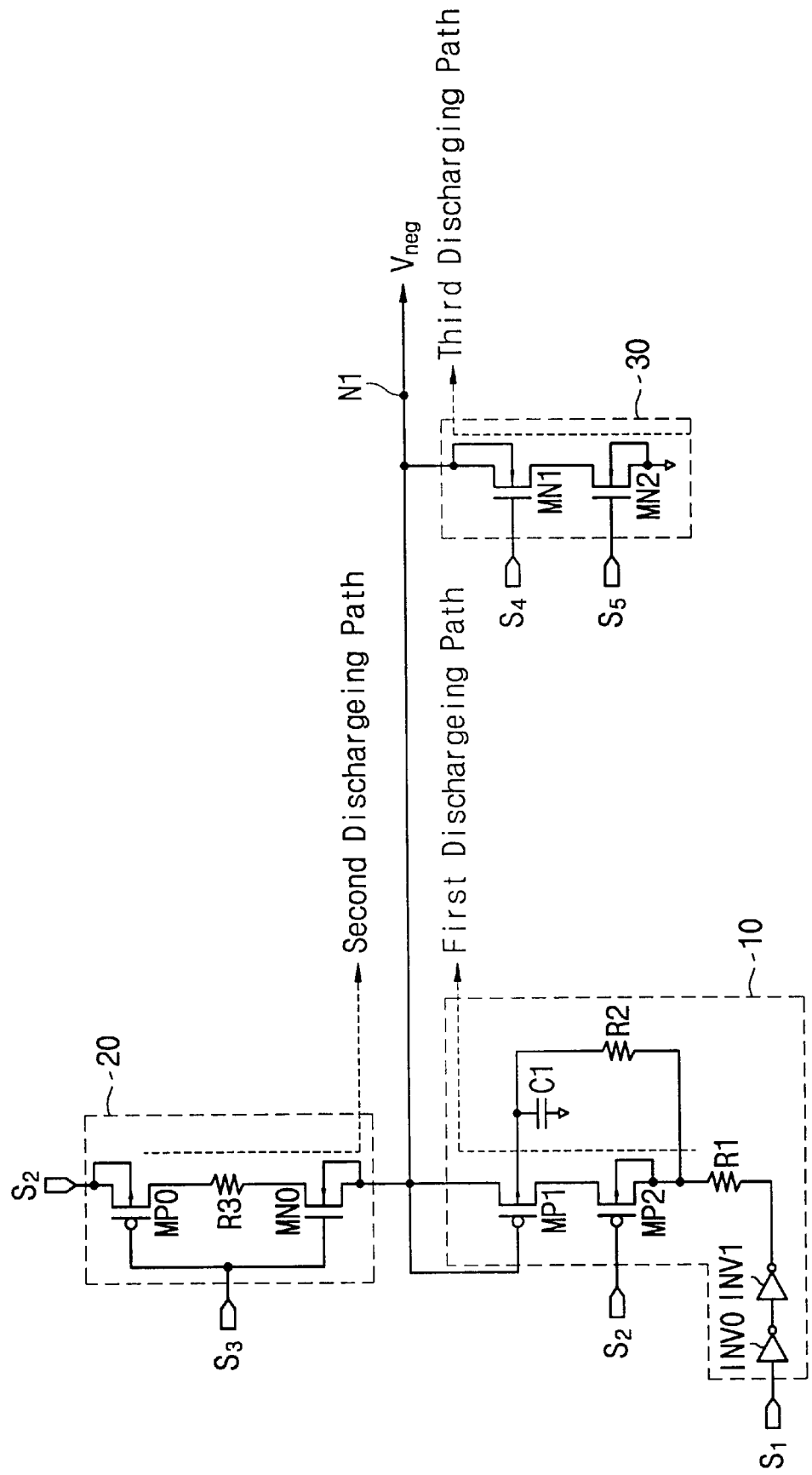
FIG. 2 is a circuit diagram of a discharging circuit according to a preferred embodiment of the present invention.

Referring to FIG. 2, the discharging circuit of the invention is formed of first, second and third discharging units, 10, 20, and 30, all of which units are connected to an output node $N_1$ for generating a negative voltage $V_{neg}$ of about −10V. The first discharging unit 10 preferably includes first and second PMOS transistors $MP_1$ and $MP_2$, first and second resistors $R_1$ and $R_2$, a capacitor $C_1$, and first and second inverters $INV_1$ and $INV_2$. The gate and source of the first PMOS transistor $MP_1$ are connected to the output node $N_1$. A first end of the first resistor $R_1$ receives a first control signal $S_1$ through serially-connected first and second inverters $INV_1$ and $INV_2$. The drain of the first PMOS transistor $MP_1$ is connected to a second end of the first resistor $R_1$ through the second PMOS transistor $MP_2$. The gate of the second PMOS transistor $MP_2$ is coupled to a second control signal $S_2$. The second end of the first resistor $R_1$ is also connected to bulk of the first PMOS transistor $MP_1$ through the second resistor $R_2$. The capacitor $C_1$ is connected to a node between the bulk of the first PMOS transistor $MP_1$ and the second resistor $R_2$.

The second discharging unit 20 includes a third PMOS transistor $MP_3$, a third resistor $R_3$ and a first NMOS transistor $MN_1$, all of which are serially connected between the second control signal $S_2$ and the first node $N_1$. The gates of the third PMOS transistor $MP_3$ and the first NMOS transistor $MN_1$ are coupled to a third control signal $S_3$ in common. The bulk of the third PMOS transistor $MP_3$ is connected to the second control signal $S_2$, and the bulk of the first NMOS transistor $MN_1$ is connected to the first node $N_1$.

The third discharging unit 30 includes second and third NMOS transistors $MN_2$ and $MN_3$, which are serially connected from the first node $N_1$ to the ground. The gate of the second NMOS transistors $MN_2$ is coupled to a fourth control signal $S_4$ and the gate of the third NMOS transistor $MN_3$ is coupled to a fifth control signal $S_5$. The bulks of the second and third NMOS transistors $MN_2$ and $MN_3$ are connected to the first node $N_1$ and the ground, respectively.

The fifth control signal $S_5$ is enabled with low level only during an erase mode, and is put into a disabled precharge state with high level. The first control signal $S_1$ is enabled with low level only when a substantial erase operation is being performed, for which all of the word lines in a selected sector are charged to a negative voltage and the bulk regions of the cell transistors in the selected sector are held at a positive voltage. The first control signal $S_1$ is disabled with high level for the real erase period.

The second control signal $S_2$ becomes the level of the power supply voltage $V_{cc}$, i.e., 5V, when $V_{neg}$ is 0V, and becomes −5V when $V_{neg}$ is −10V, according to a detection of the level of $V_{neg}$ that is half of $V_{neg}$. The second control signal $S_2$ is normally used for a power source of the circuit for supplying a negative voltage to all of the word lines in a selected sector during an erase operation. It is used to prevent the physical damages, such as destruction of an oxide layer and breakdown, falling down to 0V when $V_{neg}$ is under −5V. In other words, $S_2$ is 0V when $V_{neg}$ is under −5V, and rises to $V_{cc}$ when $V_{neg}$ is over −5V.

The third control signal $S_3$ operates to activate a discharging operation after completing an erase operation, being at a high level at the beginning of the erase cycle and being brought to a low level when $V_{neg}$ goes down to a desired level (e.g., −5V) that is a half of the negative erase voltage (e.g., −10V). The fourth control signal $S_4$ operates to electrically isolate a negative voltage from the second control signal $S_2$ in a level shifting circuit (not shown) applying a negative voltage to word lines of a selected sector during an erase operation. The fourth control signal $S_4$ maintains $V_{cc}$ in a normal state, and varies along with $V_{neg}$ when $V_{neg}$ falls down to a negative value. The voltage $V_{neg}$ changes to a negative value from 0V in an erase operation.

Figure 3:
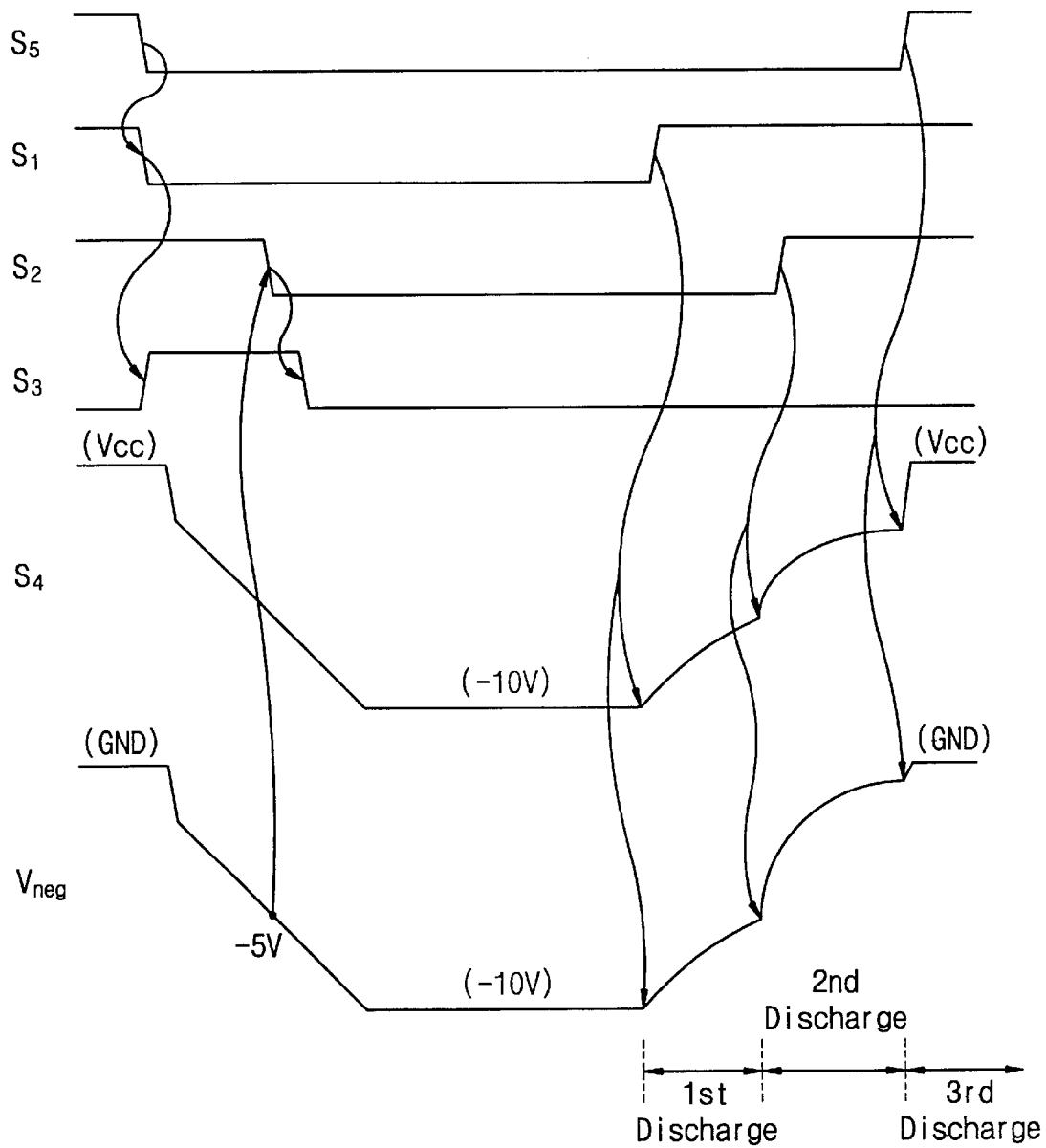
FIG. 3 is a timing diagram illustrating an operation of the discharging circuit shown in FIG. 2.

Now, an explanation will be given in conjunction with the timing chart of FIG. 3. Once an erase operation starts, $S_5$ and $S_1$ are enabled at low levels and $V_{neg}$ is generated from a negative charge pump circuit (not shown) with a negative value. Then, in the first discharging path of the circuit of FIG. 2, the first and second PMOS transistors $MP_1$ and $MP_2$ are each turned on and off until $V_{neg}$ reaches −5V. The second control signal $S_2$ is brought to a high level until $V_{neg}$ reaches −5V, which turns off the second PMOS transistor $MP_2$. Even if $V_{neg}$ is boosted up to the potential greater than −5V and $S_2$ changes to a low level from high level, the second PMOS transistor $MP_2$ is still non-conductive. In the second discharging path, since the signals $S_1$ and $S_2$ are held to $V_{cc}$ until $V_{neg}$ is −5V, the third PMOS transistor $MP_3$ is turned off while the first NMOS transistor $MN_1$ is turned on. And, even after $V_{neg}$ goes to under −5V, the transistors $MP_3$ and $MN_1$ are each held in conductive and non-conductive states. Meanwhile, in the third discharging path, the second and third NMOS transistors $MN_2$ and $MN_3$ are turned off when $V_{neg}$ has a negative voltage value under 0V.

The discharging of $V_{neg}$ to 0V first begins through the first discharging path after completing an erase operation when $S_1$ is changed to high level from low level. If $S_1$ rises to a high level, the source and bulk of the second PMOS transistor $MP_2$ are charged up to $V_{cc}$, and then the second PMOS transistor $MP_2$ is turned on because $S_2$ is at a low level. Then, the source of the first PMOS transistor $MP_1$, connected the second PMOS transistor $MP_2$ goes to $V_{cc}$ and thereby the first PMOS transistor $MP_1$ is turned on. Thereafter, a negative voltage $V_{neg}$ at the first node $N_1$ begins to be discharged. The second resistor $R_2$ and the capacitor $C_1$ delay the time of charging up the bulk of the first PMOS transistor $MP_1$ to $V_{cc}$ and thereby prevent a junction breakdown due to a voltage difference between the drain and bulk of the first PMOS transistor $MP_1$.

If the signal $V_{neg}$ is discharged to about −5V, the second control signal $S_2$ is changed to $V_{cc}$ from the ground level and then the third PMOS transistor $MP_3$ is turned on to the discharging path of $V_{neg}$ and turns to the second discharging path. Discharging through the second path is carried out until the first NMOS transistor $MN_1$ is turned off. If the fifth control signal $S_5$ is disabled by being changed to high level from low level when $V_{neg}$ is brought to about −1V, the fourth control signal $S_4$ goes to $V_{cc}$ from its negative voltage, further discharging $V_{neg}$ to 0V through the third path formed by the third discharging unit 30.

As described above, since the discharging operation for the negative voltage, after completing an erase operation, is carried out in three steps, physical damages such as a destruction of an oxide layer and a junction are thus prevented.

Although embodiment of the invention have been disclosed and described, it will be appreciate that other embodiments and modification of the invention are possible.

What is claimed is:

1. A memory device comprising:

an output node having a negative voltage; and a discharge means coupled to the output node, wherein the discharge means discharges the negative voltage step by step, and wherein the discharge means comprises a plurality of discharging units coupled in common with the output node, each of the plurality of discharging units being enabled successively in response to discharge control signals.

2. A memory device comprising:

an output node having a negative voltage; and a discharge means coupled to the output node, wherein the discharge means discharges the negative voltage step by step, and wherein the discharge means comprises:

a first discharge unit for discharging the negative voltage into a first voltage;

a second discharge unit for discharging the negative voltage into a second voltage; and a third discharge unit for discharging the second voltage into a third voltage.

3. A memory device according to claim 2, wherein the first voltage is less than the second voltage, and wherein the second voltage is less than the third voltage.

4. A memory device according to claim 3, wherein the first discharge unit comprises delay devices.

* * * * *